US006967540B2

(12) United States Patent
du Toit

(10) Patent No.: US 6,967,540 B2
(45) Date of Patent: *Nov. 22, 2005

(54) SYNTHESIZERS INCORPORATING PARASCAN TM VARACTORS

(75) Inventor: Nicholaas D du Toit, Columbia, MD (US)

(73) Assignee: Paratek Microwave, Inc., Columbia, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/794,168

(22) Filed: Mar. 5, 2004

(65) Prior Publication Data

US 2004/0233006 A1 Nov. 25, 2004

Related U.S. Application Data

(60) Provisional application No. 60/452,422, filed on Mar. 6, 2003.

(51) Int. Cl.[7] .................................................. H03L 1/00
(52) U.S. Cl. ........................... 331/107 SL; 331/177 D; 331/36 R
(58) Field of Search ..................... 331/107 SL, 99, 331/117 D, 117 R, 36 R

(56) References Cited

U.S. PATENT DOCUMENTS

| | | | | |
|---|---|---|---|---|
| 4,873,496 A | * | 10/1989 | Ohgihara et al. | 331/96 |
| 5,032,800 A | * | 7/1991 | Galani et al. | 331/1 R |
| 5,079,524 A | * | 1/1992 | Sugawara | 331/96 |
| 5,312,790 A | | 5/1994 | Sengupta et al. | 501/137 |
| 5,427,988 A | | 6/1995 | Sengupta et al. | 501/137 |
| 5,434,542 A | * | 7/1995 | Veith et al. | 331/99 |
| 5,486,491 A | | 1/1996 | Sengupta et al. | 501/137 |
| 5,565,821 A | * | 10/1996 | Murtojarvi | 331/110 |
| 5,593,495 A | | 1/1997 | Masuda et al. | 117/4 |
| 5,635,433 A | | 6/1997 | Sengupta | 501/137 |
| 5,635,434 A | | 6/1997 | Sengupta | 501/138 |
| 5,640,042 A | | 6/1997 | Koscica et al. | 257/595 |

(Continued)

Primary Examiner—Dinh T. Le
(74) Attorney, Agent, or Firm—James S. Finn

(57) ABSTRACT

A synthesizer incorporating voltage tunable capacitors, comprising at least one resonator coupled into a base circuit of a bipolar transistor, the at least one resonator including at least one voltage tunable capacitor; the bipolar transistor including a collector which terminates in a radial micro strip stub and an emitter which produces an output via an impedance matching circuit, a buffer amplifier and an RF filter; a frequency divider, programmable phase locked loop and loop filter receiving the output of the RF filter and providing the input to a controller; an integral switch mode power supply providing power to the base circuit via a first power supply filter, and the controller via a second power supply filter. The controller scales the user-selected control voltage range to the levels required by the voltage tunable capacitors associated with the at least one resonator.

The resonator of the synthesizers incorporating parascan™ varactors of the present invention can be at least one at micro strip resonator and the bipolar transistor can be a Si-bipolar transistor. The emitter of the bipolar transistor is further terminated into a short-circuited micro strip stub, thus preventing lower modes of oscillation to exist. The present invention can further comprise a buffer amplifier or circulator associated with the impedance matching circuit to reduce the pulling effect where needed. Also, the present invention can further comprise a buffer amplifier in the output circuit to amplify the output power where needed. In a preferred embodiment of the present invention the controller can be a simple one-transistor controller and the controller can have a user-specified frequency response, thus aiding integration with phase-locked loop synthesizers.

15 Claims, 1 Drawing Sheet

U.S. PATENT DOCUMENTS

| | | | |
|---|---|---|---|
| 5,693,429 A | 12/1997 | Sengupat et al. | 428/699 |
| 5,694,134 A | 12/1997 | Barnes | 343/700 |
| 5,714,914 A * | 2/1998 | Zhou | 331/117 R |
| 5,766,697 A | 6/1998 | Sengupta et al. | 427/585 |
| 5,830,591 A | 11/1998 | Sengupta et al. | 428/701 |
| 5,846,893 A | 12/1998 | Sengupta et al. | 501/137 |
| 5,886,867 A | 3/1999 | Chivukula et al. | 361/311 |
| 5,889,438 A * | 3/1999 | Yamaguchi | 331/17 |
| 5,990,766 A | 11/1999 | Zhang et al. | 333/205 |
| 6,074,971 A | 6/2000 | Chiu et al. | 501/139 |
| 6,362,708 B1 * | 3/2002 | Woods | 333/234 |
| 6,369,675 B2 * | 4/2002 | Yamada | 333/218 |
| 6,377,142 B1 | 4/2002 | Chiu et al. | 333/238 |
| 6,377,217 B1 | 4/2002 | Zhu et al. | 343/700 |
| 6,377,440 B1 | 4/2002 | Zhu et al. | 361/311 |
| 6,404,614 B1 | 6/2002 | Zhu et al. | 361/277 |
| 6,492,883 B2 | 12/2002 | Liang et al. | 333/132 |
| 6,514,895 B1 | 2/2003 | Chiu et al. | 501/137 |
| 6,525,630 B1 | 2/2003 | Zhu et al. | 333/205 |
| 6,531,936 B1 | 3/2003 | Chiu et al. | 333/164 |
| 6,535,076 B2 | 3/2003 | Partridge et al. | 333/17.1 |
| 6,538,603 B1 | 3/2003 | Chen et al. | 342/372 |
| 6,556,102 B1 | 4/2003 | Sengupta et al. | 333/161 |
| 6,590,468 B2 | 7/2003 | du Toit et al. | 333/17.3 |
| 6,597,265 B2 | 7/2003 | Liang et al. | 333/204 |
| 6,603,367 B2 * | 8/2003 | Pao et al. | 331/177 V |

* cited by examiner

SYNTHESIZERS INCORPORATING PARASCAN TM VARACTORS

CROSS-REFERENCE TO RELATED APPLICATION

This application claims priority to U.S. Provisional Patent Application Ser. No. 60/452,422, "SYNTHESIZERS INCORPORATING PARASCAN™ VARACTORS" filed Mar. 6, 2003, by Nicolaas D du Toit.

BACKGROUND OF THE INVENTION

The present invention generally relates to synthesizers and voltage tunable dielectric capacitors.

Prior art synthesizers, especially those intended for the 5–13 GHz frequency range, can be classified into five broad categories: synthesizers incorporating VCO's with GaAs-based varactors; synthesizers incorporating VCO's with Si-based varactors; synthesizers incorporating YIG-tuned oscillators; synthesizers incorporating VCO's with active elements other than silicon bipolar transistors; and synthesizers incorporating VCO's with frequency multiplied outputs. However all of the above have disadvantages and shortcomings.

The disadvantage of synthesizers incorporating VCO's with GaAs-based varactors is higher levels of phase noise due to the lower Q factor and higher noise generated by GaAs-based varactors. A significant disadvantage to synthesizers incorporating VCO's with Si-based varactors is higher levels of phase noise due to the lower Q factor and higher noise generated by Si-based varactors. Major distadvantages of synthesizers incorporating YIG-tuned oscillators are the oscillator has a larger physical volume and mass, it has higher power consumption and slower switching speed due to the heavy magnetic circuit. YIG-tuned oscillators are also prone to microphonics and phase hits.

A drawback of synthesizers incorporating VCO's with active elements other than silicon bipolar transistors is higher levels of phase noise due to the higher flicker-noise corner frequency of other active devices. Lastly, disadvantages of synthesizers incorporating VCO's with frequency multiplied outputs are higher levels of far-out phase noise and sub-harmonics due to frequency multiplication process The terms Parascan® voltage tunable capacitors, Parascan® variable capacitors, Parascan® tunable dielectric capacitors and Parascan® varactors have the same meaning and are interchangeable. Common varactors used today are Silicon and GaAs based diodes. The performance of these varactors is defined by the capacitance ratio, Cmax/Cmin, frequency range and figure of merit, or Q factor (1/tan) at the specified frequency range. The Q factors for these semiconductor varactors for frequencies up to 2 GHz are usually very good. However, at frequencies above 2 GHz, the Q factors of these varactors degrade rapidly. At 10 GHz the Q factors for these varactors are usually only about 30.

Varactors that utilize a thin film ferroelectric ceramic as a voltage tunable element in combination with a superconducting element have been described. For example, U.S. Pat. No. 5,640,042 discloses a thin film ferroelectric varactor having a carrier substrate layer, a high temperature superconducting layer deposited on the substrate, a thin film dielectric deposited on the metallic layer, and a plurality of metallic conductive means disposed on the thin film dielectric, which are placed in electrical contact with RF transmission lines in tuning devices. Another tunable capacitor using a ferroelectric element in combination with a superconducting element is disclosed in U.S. Pat. No. 5,721,194.

Commonly owned U.S. patent application Ser. No. 09/419,126, filed Oct. 15, 1999, and titled "Voltage Tunable Varactors And Tunable Devices Including Such Varactors", discloses voltage tunable varactors that operate at room temperature and various devices that include such varactors. Commonly owned U.S. patent application Ser. No. 09/434,433, filed Nov. 4, 1999, and titled "Ferroelectric Varactor With Built-In DC Blocks" discloses voltage tunable varactors that include built-in DC blocking capacitors. These varactors operate at room temperatures to provide a tunable capacitance.

The assignee of the present invention and in the patent and patent applications incorporated by reference has developed the materials technology that enables these tunable varactors which have high Q values resulting low losses and extremely high IP3 characteristics, even at high frequencies. The articulation of the novel tunable material technology is elaborated on in the patent and patent application incorporated in by reference.

Therefore, a strong need in the synthesizer industry exists for synthesizers incorporating voltage controlled oscillators (VCO's) that can utilize novel voltage tunable dielectric capacitors to overcome the aforementioned disadvantages of existing synthesizers.

SUMMARY OF THE INVENTION

The present invention provides a synthesizer incorporating voltage tunable capacitors, comprising at least one resonator coupled into a base circuit of a bipolar transistor, the at least one resonator including at least one voltage tunable capacitor; the bipolar transistor including a collector which terminates in a radial micro strip stub and an emitter which produces an output via an impedance matching circuit, a buffer amplifier and an RF filter; a frequency divider, programmable phase locked loop and loop filter receiving the output of the RF filter and providing the input to a controller; an integral switch mode power supply providing power to the base circuit via a first power supply filter, and the controller via a second power supply filter. The controller scales the user-selected control voltage range to the levels required by the voltage tunable capacitors associated with the at least one resonator.

The resonator of the synthesizers incorporating parascan™ varactors of the present invention can be at least one at micro strip resonator and the bipolar transistor can be a Si-bipolar transistor. The emitter of the bipolar transistor is further terminated into a short-circuited micro strip stub, thus preventing lower modes of oscillation to exist. The present invention can further comprise a buffer amplifier or circulator associated with the impedance matching circuit to reduce the pulling effect where needed. Also, the present invention can further comprise a buffer amplifier in the output circuit to amplify the output power where needed. In a preferred embodiment of the present invention the controller can be a simple one-transistor controller and the controller can have a user-specified frequency response, thus aiding integration with phase-locked loop synthesizers.

The present invention further provides a method of controlling a synthesizer using voltage tunable capacitors, comprising providing at least one resonator coupled into a base circuit of a bipolar transistor, the at least one resonator including at least one voltage tunable capacitor; the bipolar transistor including a collector which terminates in a radial micro strip stub and an emitter which produces an output via an impedance matching circuit, a buffer amplifier and an RF filter; providing a frequency divider, programmable phase locked loop and loop filter receiving the output of the RF filter and providing the input to a controller; providing an integral switch mode power supply providing power to the base circuit via a first power supply filter, and the controller via a second power supply filter; and scaling the user-selected control voltage range via the controller to the levels required by the voltage tunable capacitors associated with the at least one resonator.

DESCRIPTION OF THE PREFERRED EMBODIMENT

Figure 1:
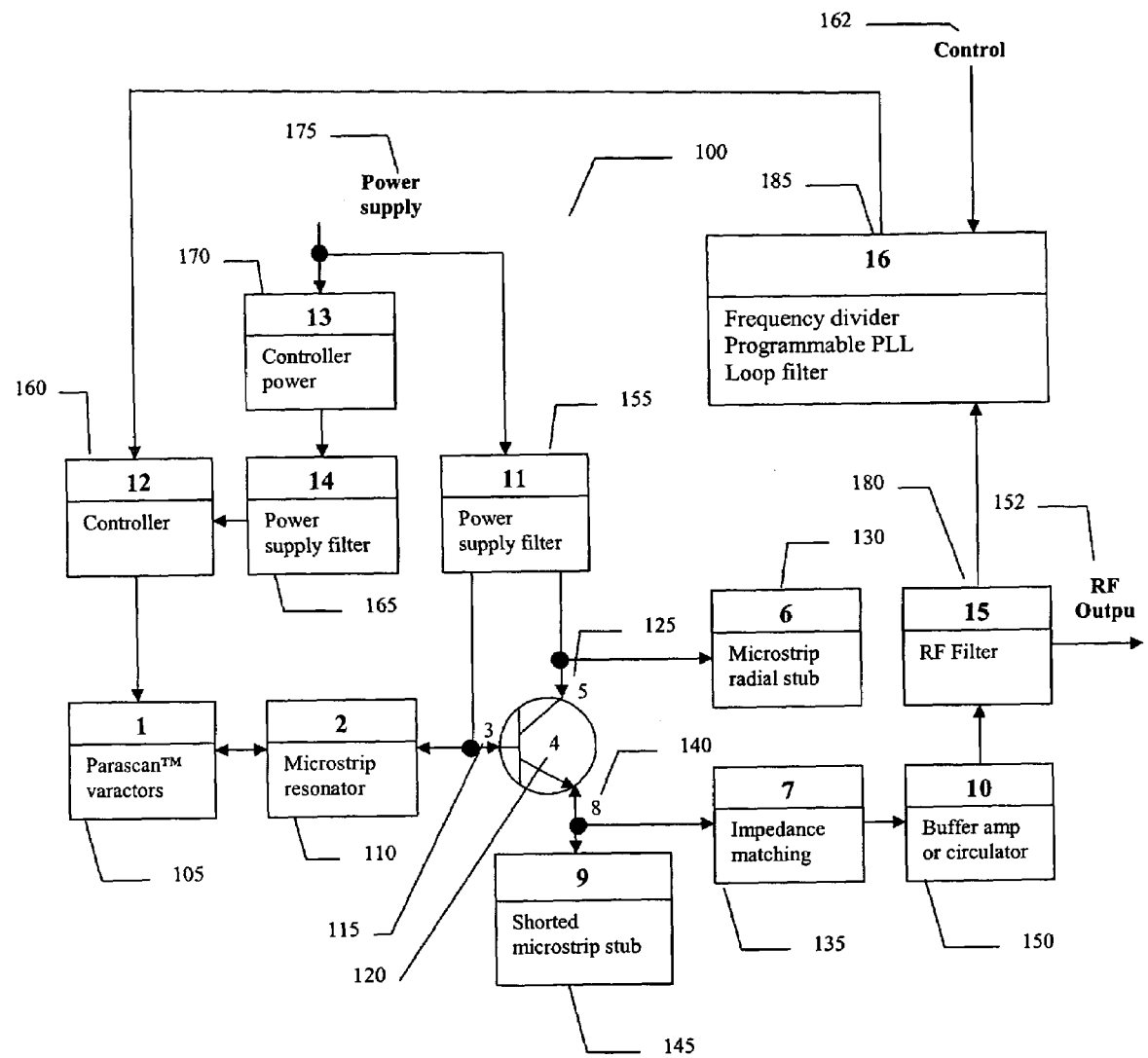
FIG. 1 illustrates a functional block diagram of one preferred embodiment of a synthesizer incorporating Parascan™ varactors of the present invention.

This invention provides an optimal solution towards Synthesizers with output frequencies in the range 5 to 13 GHz. Synthesizers incorporating fundamental mode VCO's, Parascan™ varactors and silicon bipolar transistors in embodiments described in this invention, exhibit greatly improved performance in terms of the following parameters:
a. Low phase noise;
b. Low flicker noise corner frequency;
c. No sub-harmonics;
d. Low spurious;
e. Low microphonics;
f. No phase hits;
g. Fast switching speed;
h. Small size; and
i. Low power consumption;

Turning now to the figures, FIG. 1, shown generally as 100, illustrates a functional block diagram of a VCO incorporating Parascan® varactor. Parascan® varactors 105 are used in a microstrip resonator 110 providing a high resonator Q-factor. Negligible noise is generated by the Parascan® varactors 105. The resonator 110 is coupled into the base circuit 115 of a Si-bipolar transistor 120, thus providing a low flicker noise corner frequency.

The collector 125 of the Si-bipolar transistor 120 is terminated in a radial microstrip stub 130 providing an RF short at the frequency of oscillation, thus ensuring the conditions under which oscillation can exist.

The output is coupled via an impedance matching circuit 135s buffer amplifier or a circulator 150 and an RF Filter 180 to the emitter 140 of the Si-bipolar transistor 120. RF Filter 180 is added in the output circuit to prevent harmonics of the clock and reference frequency from exiting the synthesizer. The emitter 140 of the Si-bipolar transistor 120 is further terminated into a short-circuited microstrip stub 145, preventing lower modes of oscillation to exist. Further, the output of RF filter 180 is input to state-of-the-art frequency divider, programmable phase locked loop and loop filter 185.

The frequency divider, programmable phase locked loop and loop filter 185 provides fast switching, low spurious, and low close-in phase noise. Control 162 is also provided to frequency divider, programmable phase locked loop and loop filter 185 as shown at 162. The output of frequency divider programmable PLL loop filter 185 is provided to controller 160.

Again, a buffer amplifier 150 may be added in the output circuit to amplify the output power 152 where needed.

Filtering, via power supply filter 155, the power supply input and regulating the supply voltage essentially eliminate the pushing effect. Control 162 is provided by a simple one-transistor controller 160 which scales the user-selected control voltage range to the levels required by the Parascan® varactors 105. The controller 160 has a user-specified frequency response, thus aiding integration with phase-locked loop synthesizers.

A power supply 175 provides power to an integral switch-mode power supply 170 which generates the rail voltage for the controller 160. Filtering 165 provide sufficient rejection of switching noise prior to reaching controller 160.

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. Thus, the breadth and scope of the present invention should not be limited by any of the above-described exemplary embodiments, but should be defined only in accordance with the following claims and their equivalents.

What is claimed is:

1. A synthesizer incorporating voltage tunable capacitors, comprising:
    at least one resonator coupled into a base circuit of a bipolar transistor, said at least one resonator including at least one voltage tunable capacitor;
    said bipolar transistor including a collector which terminates in a radial micro strip stub and an emitter which produces an output via an impedance matching circuit, a buffer amplifier and an RF filter,
    a frequency divider, programmable phase locked loop and loop filter receiving said output of said RF filter and providing an input to a controller;
    an integral switch mode power supply providing power to said base circuit via a first power supply filter, and said controller via a second power supply filter; and
    said controller scales a user-selected control voltage range to levels required by said at least one voltage tunable capacitors associated with said at least one resonator.

2. The synthesizer incorporating voltage tunable capacitors of claim 1, wherein said at least one resonator is at least one at micro strip resonator.

3. The synthesizer incorporating voltage tunable capacitors of claim 1, wherein said bipolar transistor is a Si-bipolar transistor.

4. The synthesizer incorporating voltage tunable capacitors of claim 1, wherein said emitter of said bipolar transistor is further terminated into a short-circuited micro strip stub.

5. The synthesizer incorporating voltage tunable capacitors of claim 1, wherein said buffer amplifier is replaced with a circulator associated with said impedance matching circuit.

6. The synthesizer incorporating voltage tunable capacitors of claim 1, further comprising at least one additional buffer amplifier in the output circuit.

7. The synthesizer incorporating voltage tunable capacitors of claim 1, wherein said controller is a simple one-transistor controller.

8. A method of controlling an synthesizer using voltage tunable capacitors, comprising:

providing at least one resonator coupled into a base circuit of a bipolar transistor, said at least one resonator including at least one voltage tunable capacitor;

said bipolar transistor including a collector which terminates in a radial micro strip stub and an emitter which produces an output via an impedance matching circuit, a buffer amplifier and an RF filter;

providing a frequency divider, programmable phase locked loop and loop filter receiving said output of said RE filter and providing an input to a controller;

providing an integral switch mode power supply providing power to said base circuit via a first power supply filter, and said controller via a second power supply filter; and scaling a user-selected control voltage range via said controller to the levels required by said at least one voltage tunable capacitor associated with said at least one resonator.

9. The method of controlling an synthesizer using voltage tunable capacitors of claim 8, wherein said at least one resonator is at least one at micro strip resonator.

10. The method of controlling an synthesizer using voltage tunable capacitors of claim 8, wherein said bipolar transistor is a Si-bipolar transistor.

11. The method of controlling an synthesizer using voltage tunable capacitors of claim 8, wherein said emitter of said bipolar transistor is further terminated into a short-circuited micro strip stub.

12. The method of controlling an synthesizer using voltage tunable capacitors of claim 9, further comprising the step of providing a buffer amplifier associated with said impedance matching circuit.

13. The method of controlling an synthesizer using voltage tunable capacitors of claim 8, further comprising the step of providing a circulator associated with said impedance matching circuit.

14. The method of controlling a synthesizer using voltage tunable capacitors of claim 8, further comprising the step of providing a buffer amplifier in the output circuit.

15. The method of controlling an synthesizer using voltage tunable capacitors of claim 8, wherein said controller is a simple one-transistor controller.

* * * * *